US011664059B2

(12) United States Patent
Houssameddine et al.

(10) Patent No.: US 11,664,059 B2
(45) Date of Patent: May 30, 2023

(54) LOW POWER MTJ-BASED ANALOG MEMORY DEVICE

(71) Applicant: International Business Machines Corporation, Armonk, NY (US)

(72) Inventors: Dimitri Houssameddine, Sunnyvale, CA (US); Saba Zare, White Plains, NY (US); Heng Wu, Guilderland, NY (US); Karthik Yogendra, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 17/336,994

(22) Filed: Jun. 2, 2021

(65) Prior Publication Data
US 2022/0392504 A1    Dec. 8, 2022

(51) Int. Cl.
G11C 16/04     (2006.01)
G11C 11/16     (2006.01)
G11C 27/00     (2006.01)
H01F 10/32     (2006.01)

(52) U.S. Cl.
CPC ........ G11C 11/161 (2013.01); G11C 11/1673 (2013.01); G11C 11/1675 (2013.01); G11C 27/005 (2013.01); H01F 10/3254 (2013.01); H01F 10/3286 (2013.01); H10N 50/01 (2023.02); H10N 50/80 (2023.02)

(58) Field of Classification Search
CPC .............. G11C 11/161; G11C 11/1673; G11C 11/1675; G11C 27/005
See application file for complete search history.

(56) References Cited

U.S. PATENT DOCUMENTS

| | | | |
|---|---|---|---|
| 7,813,168 B2 | 10/2010 | Zhu | |
| 8,379,429 B2 | 2/2013 | Ishiwata | |
| 9,324,403 B2 | 4/2016 | Khalili | |
| 10,008,248 B2 * | 6/2018 | Buhrman | ............ G11C 11/1697 |
| 2003/0058685 A1 | 3/2003 | Tran | |
| 2004/0188734 A1 | 9/2004 | Tsang | |
| 2010/0097845 A1 | 4/2010 | Sakimura | |
| 2011/0298067 A1 | 12/2011 | Ishiwata | |
| 2013/0182501 A1 | 7/2013 | Sakimura | |
| 2013/0250665 A1 | 9/2013 | Kitagawa | |
| 2013/0320468 A1 | 12/2013 | Zhu | |
| 2014/0010004 A1 | 1/2014 | Suzuki | |
| 2014/0254250 A1 | 9/2014 | Mani | |
| 2016/0308116 A1 | 10/2016 | Noh | |
| 2018/0211994 A1 | 7/2018 | Kim | |
| 2018/0350432 A1 | 12/2018 | Sasaki | |

(Continued)

OTHER PUBLICATIONS

"MTJ-Based Analog Memory Device," U.S. Appl. No. 17/081,515, filed Oct. 27, 2020.

(Continued)

*Primary Examiner* — Pho M Luu
(74) *Attorney, Agent, or Firm* — Heather Johnston

(57) ABSTRACT

A memory system may include a magnetic tunnel junction stack, a first high resistance tunnel barrier, and a first voltage controlled magnetic anisotropy write layer. The first voltage controlled magnetic anisotropy write layer may be adjacent the high resistance tunnel barrier, and the voltage controlled magnetic anisotropy write line may include a magnetic material in direct contact with a high resistance tunnel barrier.

20 Claims, 6 Drawing Sheets

(56) References Cited

U.S. PATENT DOCUMENTS

2018/0358105 A1    12/2018  Sasaki
2019/0006415 A1*   1/2019  Li ........................ G11C 11/1675
2022/0037586 A1*   2/2022  Jeong .................... H01L 27/228

OTHER PUBLICATIONS

Anonymous. "Method and Structure for Creating In-Plane Magnetic Tunnel Junction for Memristive Devices Using Perpendicular Polarized Layer." Published Oct. 8, 2019. 4 pages. Published by IP.com. https://priorart.ip.com/PCOM/000260007.

Cai, et al., "Enabling Resilient Voltage-Controlled MeRAM Using Write Assist Techniques." Published in 2018. 5 pages. In 2018 IEEE International Symposium on Circuits and Systems (ISCAS), Florence, Italy, pp. 1-5. https://ieeexplore.IEEE.org/abstract/document/8350919.

Ikeda, et al., "Tunnel magnetoresistance of 604% at 300K by suppression of Ta diffusion in CoFeB/MgO/CoFeB pseudo-spin-valves annealed at high temperature." Published in 2008. 4 pages. In Appl. Phys. Lett. 93, 082508. Published by AIP. http://dx.doi.org/10.1063/1.2976435.

List of IBM Patents or Patent Applications Treated as Related, Jun. 1, 2021, 2 pgs.

Maciel, et al., "Voltage-Controlled Magnetic Anisotropy MeRAM Bit-Cell over Event Transient Effects." Published Apr. 5, 2019. 14 pages. In Journal of Low Power Electronics and Applications. 9. 15. Published by Research Gate. https://www.researchgate.net/publication/332235547.

Sharma, N., et al., Magneto-Electric Magnetic Tunnel Junction Based Analog Circuit Options, 2017 30th IEEE International System-on-Chip Conference, Dec. 21, 2017, pp. 179-183. https://ieeexplore.ieee.org/document/8226032.

Doevenspeck J. et al., "SOT-MRAM based Analog in-Memory Computing for DNN inference", 2020 IEEE Symposium on Vlsi Technology, IEEE, Jun. 16, 2020 (Jun. 16, 2020), pp. 1-2.

"Patent Cooperation Treaty PCT Notification of Transmittal of the International Search Report and the Written Opinion of the International Searching Authority, or the Declaration", Applicant's file reference P202002925, International application No. PCT/EP2021/078493, International filing date Oct. 14, 2021 (Oct. 14, 2021), dated Feb. 3, 2022 (Mar. 2, 2022), 20 pages.

* cited by examiner

LOW POWER MTJ-BASED ANALOG MEMORY DEVICE

BACKGROUND

The present disclosure relates to analog memory and more specifically to magnetic memory devices including magnetic tunnel junction.

Memory is used for storage and computation. Analog memory has attracted research as it offers certain attributes that may make analog memory preferable in certain scenarios over other forms of memory. Analog memory may implement resistance change memory using a resistance variable element to allow varying resistance across a medium between electrodes such that the medium changes resistance based on the activity of the electrodes.

The domain wall movement inside magnetic medium can induce resistance change. By using the resistance change, analog memory can be realized.

SUMMARY

Embodiments of the present disclosure include a system and method for analog memory storage.

A memory system in accordance with the present disclosure may include a magnetic tunnel junction stack, a first high resistance tunnel barrier, and a first voltage controlled magnetic anisotropy write layer. The first voltage controlled magnetic anisotropy write layer may be adjacent the high resistance tunnel barrier, and the voltage controlled magnetic anisotropy write line may include a magnetic material in direct contact with a high resistance tunnel barrier.

The above summary is not intended to describe each illustrated embodiment or every implement of the disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
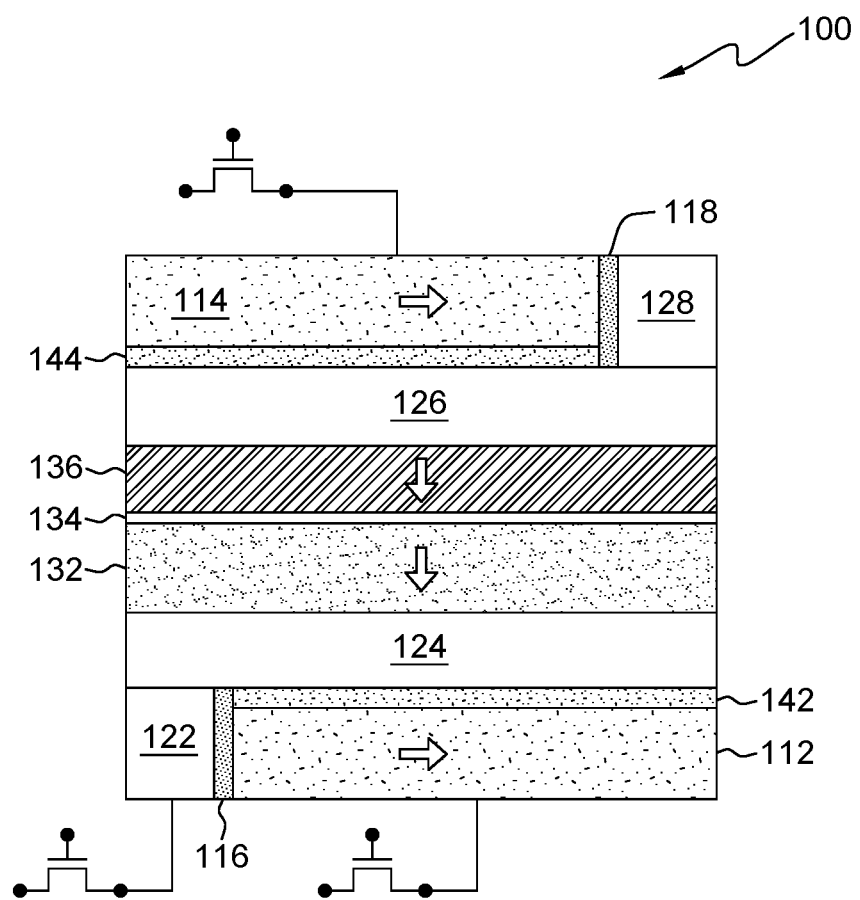
FIG. 1 illustrates a memory device in accordance with some embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to analog memory and more specifically to magnetic memory devices including magnetic tunnel junction.

Analog memory devices for AI applications are based on non-volatile memory (NVM) such as phase change memory (PCM) and resistive random-access memory (ReRAM). Magnetic tunnel junction (MTJ) devices are reliable and perform well. Spin-polarized current may be used to push a magnetic domain laterally in the storage layer; the location of the domain wall may determine the resistance level of the MTJ.

A magnetic field is generated by adjacent magnetic layers, and this magnetic field may be used to generate an arbitrary number of magnetic domains in the storage layer. The resistance of the device may thus be determined by the number of domains in the storage layer and may vary between a low resistance state, such as a single domain parallel (P) to the reference layer, and a high resistance state, such as a single domain anti-parallel (AP) to reference layer. Voltage-controlled magnetic anisotropy (VCMA) may be used to switch the magnetization of write layers from P to AP.

Voltage drops across VCMA tunnel barriers because VCMA tunnel barriers are higher resistance than MTJ tunnel barriers. VCMA layers are designed to be in-plane but almost fully compensated such that perpendicular anisotropy almost cancels the demagnetization field. Application of a voltage on a VCMA tunnel barrier causes the free layer to point out-of-plane for one polarity and remain in-plane for the other polarity. When the VCMA write layer tilts out-of-plane, it projects a magnetic field that programs the free layer. To read the device, the tunneling magnetoresistance (TMR) may be observed by applying a low read bias across the MTJ. TMR is the difference between higher state and lower state divided between the lower state resistance.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It is to be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present disclosure discusses an analog memory device that may include dielectric material, a bottom contact stud formation, and one or more ferromagnetic (FM) layers, tunnel barrier (TB) layers, metal, interlayer dielectric (ILD) layers, free layers, thin TB layers, and reference layers. Tunnel barriers may be referred to as high resistance-area (high-RA) components or high-RA tunnel barriers.

The present disclosure discusses the manufacture of such analog memory devices including the deposit of the aforementioned layers on a base such as a dielectric, patterning, ion beam etch (IBE) processes, chemical mechanical polishing (CMP), and other component formation. Manufacture of analog memory devices may include repeating one or more of these processes to generate various layers in the proper shape and/or size for a given application.

A memory system in accordance with the present disclosure may include a magnetic tunnel junction stack, a first high resistance tunnel barrier, and a first voltage controlled magnetic anisotropy write layer. The first voltage controlled magnetic anisotropy write layer may be adjacent the high resistance tunnel barrier, and the voltage controlled magnetic anisotropy write line may include a magnetic material in direct contact with a high resistance tunnel barrier.

In some embodiments of the present disclosure, the magnetic tunnel junction stack may include a storage layer, a reference layer, and a tunnel barrier between the storage layer and the reference layer. In some embodiments, the tunnel barrier may separate a magnetic storage layer from a magnetic reference layer in the magnetic junction stack, and a voltage applied with the voltage controlled magnetic anisotropy write line may affect a spin orientation of the magnetic storage layer.

In some embodiments of the present disclosure, the system includes a second high resistance tunnel barrier and a second voltage controlled magnetic anisotropy write layer.

In some embodiments of the present disclosure, the system includes a non-magnetic metal between the magnetic tunnel junction stack and the first high resistance tunnel barrier.

In some embodiments of the present disclosure, applying a voltage to the first voltage controlled magnetic anisotropy write layer alters a spin orientation of the magnetic tunnel junction stack. In some embodiments, the first voltage controlled magnetic anisotropy write layer may apply a write current between 25 µA and 100 µA to alter the spin orientation of the magnetic tunnel junction stack. Changing the spin orientation of the magnetic storage layer may change the tunneling magnetoresistance of the magnetic storage layer and may thereby permit the generation of an arbitrary number of magnetic domains in a single storage layer. In some embodiments of the present disclosure, a read current of the memory system is between 0.05 µA and 0.5 µA.

In some embodiments of the present disclosure, the first voltage controlled magnetic anisotropy write layer is ferromagnetic. In some embodiments of the present disclosure, the first high resistance tunnel barrier has a resistance greater than 90,000 ohms. In some embodiments of the present disclosure, an on/off ratio of the memory system is between 6 and 14.

FIG. 1 illustrates a memory device 100 in accordance with some embodiments of the present disclosure. Memory device 100 has a lower VCMA write layer 112 and an upper VCMA write layer 114. Dielectric separators 116 and 118 separate the contacts from non-magnetic metal 122 and 128. A TB 142 separates the lower VCMA write layer 112 from a non-magnetic metal 124 which is adjacent a magnetic storage layer 132. A thin TB 134 is between the magnetic storage layer 132 and a magnetic reference layer 136. A non-magnetic metal 126 is adjacent the magnetic reference layer 136. A TB 144 separates the upper VCMA write layer 114 from the non-magnetic metal 126 and the adjacent magnetic reference layer 136. The magnetic storage layer 132 may be referred to as a free layer or soft layer. The magnetic reference layer 136 may be referred to as a fixed layer, pinned layer, or hard layer.

Figure 2A:
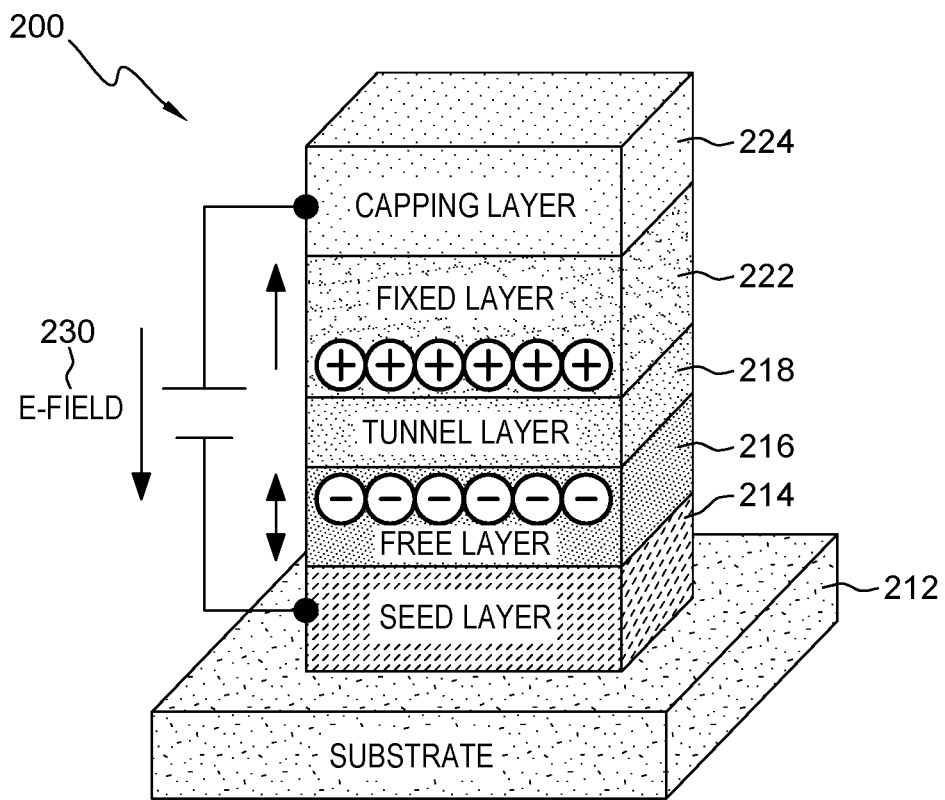
FIG. 2A depicts a memory device in accordance with some embodiments of the present disclosure.
Figure 2B:
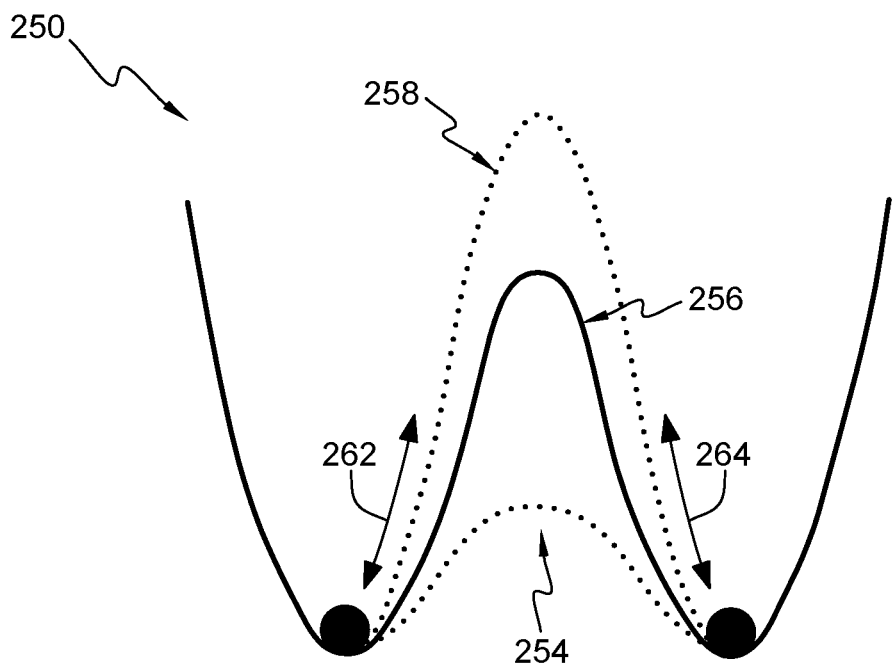
FIG. 2B depicts the magnetization change of a memory device in accordance with some embodiments of the present disclosure.

FIG. 2A depicts a memory device 200 and FIG. 2B depicts a graph 250 of the magnetization change of the memory device 200 in accordance with some embodiments of the present disclosure. Memory device 200 has multiple layers. The layers of the memory device 200 include a substrate 212, a seed layer 214, a free layer 216, a tunnel barrier 218, a fixed layer 222, and a capping layer 224.

The free layer 216 and the fixed layer 222 are ferromagnetic (FM) layers. The free layer 216 may also be referred to as a soft layer, and the fixed layer 222 may also be referred to as the pinned or hard layer. The tunnel barrier 218 is an antiferromagnetic layer; the tunnel barrier 218 may also be referred to as an insulating layer or a high-RA layer.

An energy field (E-field) 230 may be applied to the memory device 200 to alter the ease with which a magnetization state may be changed. The graph 250 shows a barrier 256 between the parallel (P) magnetization state and the antiparallel (AP) magnetization state without a voltage bias (Vbias). The barrier 256 can be lowered to a lowered barrier 254 with a positive Vbias. The barrier 256 can be heightened to a heightened barrier 258 with a negative Vbias. VCMA may be used to switch the magnetization of the write layers from in-plane to out-of-plane and vice versa to ease the switching of the storage layer.

Figure 3:
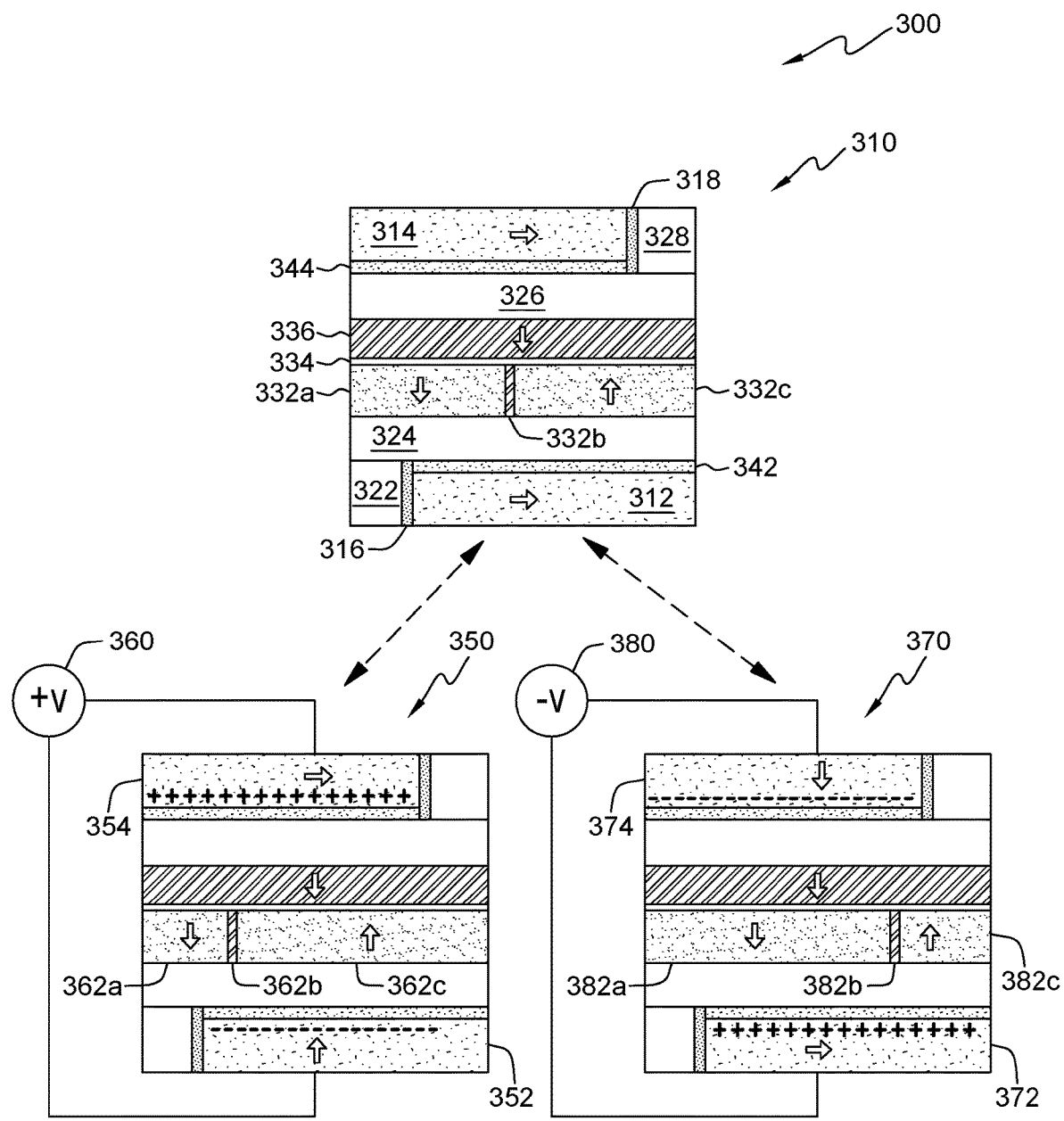
FIG. 3 illustrates a memory device in accordance with some embodiments of the present disclosure.

FIG. 3 illustrates a memory device 300 in accordance with some embodiments of the present disclosure. Memory devices 100, 200, and 300 may be the same or substantially similar. The memory device 300 is shown in three different states: a neutral state 310, a write high state 350, and a write low state 370. The memory device 300 may change between the neutral state 310, the write high state 350, and the write low state 370.

The memory device 300 has a has VCMA write layers 312 and 314, dielectric separators 316 and 318, non-magnetic metal 322, 324, 326, and 328, TBs 342 and 344, a magnetic storage layer 332a-332c, a thin TB 334, and a magnetic reference layer 336.

Voltage drops mainly across VCMA tunnel barriers because the VCMA tunnel barriers have higher resistance than MTJ tunnel barriers. VCMA layers are designed to be in-plane with perpendicular anisotropy to cancel the demagnetization field as compensation. The application of voltage on a VCMA tunnel barrier causes the magnetic storage layer 332a-332c to point-out-of-plane for one polarity while remaining in-plane for the other polarity. Applying a voltage on the VCMA write layers 312 and 314 also causes the VCMA write layers 312 and 314 to tilt out-of-plane. When a VCMA write layer 312 and 314 tilts out-of-plane, it projects a magnetic field that programs the magnetic storage layer 332a-332c.

The memory device 300 is shown in three states: the neutral state 310, the write high state 350, and the write low state 370. The neutral state 310 may also be referred to as an initial state, or a state without applied voltage. The memory device 300 may change from one state to another, e.g., from the neutral state 310 to the write high state 350 and then from the write high state 350 to the write low state 370. Voltage 360 and 380 may be applied to achieve the desired state, e.g., to achieve the write high state 350 or the write low state 370. Depending on the pulse width and amplitude applied on the VCMA write layer, the domain wall can move and have difference resistance states.

In a write high state 350, the voltage 360 is applied such that a positive charge is applied to the high VCMA write layer 354 and a negative charge is applied to the low VCMA write layer 352. A write high state 350 results in the low VCMA write layer 352 shifting out-of-plane (indicated by the changed direction of the arrow on the low VCMA write layer 352). As a result, a negative charge emanates from the low VCMA write layer 352, applying an upward magnetic field against the magnetic storage layer 362a-362c. The magnetic storage layer 362a-362c aligns its plane in the direction of travel of the flow of the negative charge. Thus, the magnetic storage layer 362a-362c aligns its plane with the low VCMA write layer 352 such that the area of the first portion of the magnetic storage layer 332a diminishes and the area of the second portion of the magnetic storage layer 332c increases.

In a write low state 370, the voltage 380 is applied such that a positive charge is applied to the low VCMA write layer 372 and a negative charge is applied to the high VCMA write layer 354. A write low state 370 results in the high VCMA write layer 344 shifting out-of-plane (indicated by the changed direction of the arrow on the high VCMA write layer 374). As a result, a negative charge emanates from the high VCMA write layer 374, applying a downward magnetic field against the magnetic storage layer 382a-382c. The magnetic storage layer 382a-382c aligns its plane in the direction of travel of the flow of the negative charge. Thus, the magnetic storage layer 382a-382c aligns its plane with the high VCMA write layer 374 such that the area of the first portion of the magnetic storage layer 382a increases and the area of the second portion of the magnetic storage layer 382c decreases.

The resistance of the memory device 300 may be altered by changing the direction of the magnetic storage layer 332a-332c with respect to the reference layer 336. A method of storing data in accordance with the present disclosure may include providing a magnetic tunnel junction memory device with a magnetic storage layer, a tunnel barrier layer, and a reference layer. The method may also include applying a voltage to a voltage controlled magnetic anisotropy write line to change a magnetization of the voltage controlled magnetic anisotropy write line.

In some embodiments of the present disclosure, the method may include changing the magnetization of the voltage controlled magnetic anisotropy write line changes a spin orientation of the magnetic storage layer. In some embodiments of the present disclosure, the voltage applied to the voltage controlled magnetic anisotropy write line may be a write current between 25 µA and 100 µA.

Figure 4A:
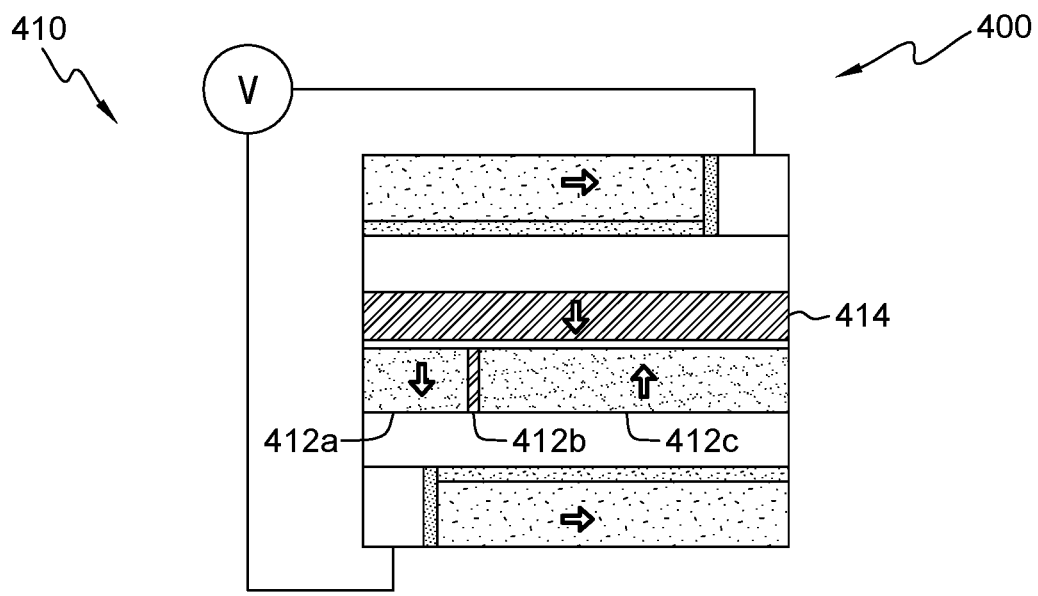
FIG. 4A depicts a memory device in accordance with some embodiments of the present disclosure.
Figure 4B:
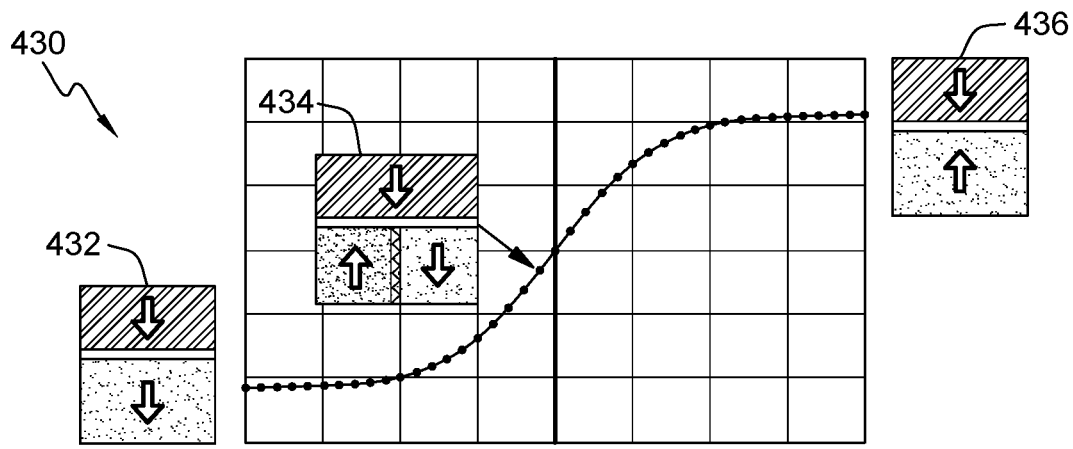
FIG. 4B illustrates a resistance graph of the change of magnetization and resistance of a memory device in accordance with some embodiments of the present disclosure.
Figure 4C:
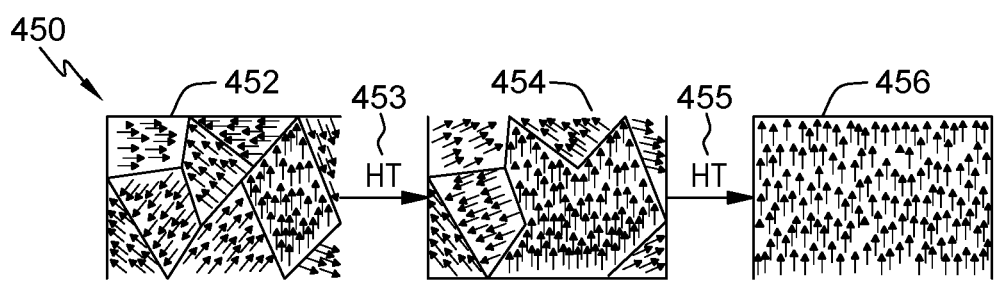
FIG. 4C depicts the transition of a memory device from one state of resistance to another in accordance with some embodiments of the present disclosure.

FIG. 4A depicts a memory device 410 in accordance with some embodiments of the present disclosure. FIG. 4B illustrates a resistance graph 430 of the change of magnetization and resistance of the memory device 410. FIG. 4C depicts the transition 450 of a memory device 410 from one state of resistance to another.

The memory device 410 has a magnetic storage layer 412a-412c that may change such that the resistance of the memory device 410 may change. The more the magnetic storage layer 412a-412c is in line with the reference layer 414, the lower the resistance of the memory device 410 will be. In other words, if a first portion 412a of the magnetic storage layer 412a-412c is aligned with the reference layer 414, then the greater the area of the first portion 412a of the magnetic storage layer 412a-412c, the lower the resistance of the memory device 410 will be. Similarly, if a first portion 412a of the magnetic storage layer 412a-412c is aligned with the reference layer 414, then the lesser the area of the first portion 412a of the magnetic storage layer 412a-412c, the greater the resistance of the memory device 410 will be.

The converse statement can also be made: if a second portion 412c of the magnetic storage layer 412a-412c is counter in alignment to the reference layer 414, then the greater the area of the second portion 412c of the magnetic storage layer 412a-412c, the higher the resistance of the memory device 410 will be. Similarly, if a second portion 412c of the magnetic storage layer 412a-412c is counter in alignment to the reference layer 414, then the lesser the area of the second portion of the magnetic storage layer 412b, the lower the resistance of the memory device 410 will be.

The memory device 410 is shown undergoing magnetization change 400. The resistance graph 430 in FIG. 4B shows the change in resistivity of a memory device 410 as the magnetic storage layer 412a-412c changes. In a low-resistance state 432, the magnetic storage layer 412a-412c is mostly or entirely aligned with the reference layer 414 such that the magnetic storage later 412a-412c is generally parallel in alignment with the reference layer 414. In the neutral state 434 which has a moderate resistivity, the magnetic storage layer 412a-412c is approximately evenly split between the first portion 412a and the second portion 412c of the magnetic storage layer such that the first portion 412a and the second portion 412c are approximately equal in area. In a high-resistance state 436, the magnetic storage layer 412a-412c is mostly or entirely counter in alignment to the reference layer 414 such that the magnetic storage later 412a-412c is generally anti-parallel in alignment with the reference layer 414.

FIG. 4C is a depiction of the transition 450 from a neutral state 434 to a high-resistance state 436. In the neutral state 434, the spin orientation is mixed between parallel, anti-parallel, and non-parallel as shown in neutral polarity diagram 452. A non-parallel spin orientation may include any orientation that is neither parallel nor anti-parallel, such as perpendicular or other-angled spin orientations. The spin orientation is described in reference to how it compares to the spin orientation of the reference layer 414.

The spin orientation may change such that the spin orientation becomes more or less aligned internally (i.e., with itself) and externally (e.g., with the reference layer). The transition 450 shows a gradual transition from a neutral state 434 with a neutral polarity diagram 452 to a state that is between neutral and anti-parallel as shown in moderately anti-parallel diagram 454 and then to an anti-parallel state 436 as shown in antiparallel diagram 456.

The transition from the neutral state 434 to the anti-parallel state 436 may occur in stages. The first transition 453 increases the spin orientation from the neutral state 434 toward the anti-parallel state 436 and achieves a moderately anti-parallel state as shown in the moderately anti-parallel diagram 454. The second transition 455 further increases the spin orientation from the moderately anti-parallel state to achieve an anti-parallel state 436 as the spin orientations shown in the antiparallel diagram 456 are shown.

While the transition 450 is shown changing from an initial state that is a neutral state 434 to a write high state that is an anti-parallel state 436, the polarity may change in either direction and from any state to any other state. For example, a memory device 410 may be in a moderately antiparallel state, such as the one depicted by the moderately antiparallel diagram 454, and transitioning to a moderately or fully parallel state. Similarly, a memory device 410 may be in an anti-parallel state 436 and the desired TMR is that of the neutral state 434 such that a voltage is applied to the memory device 410 to change the spin orientation from that shown in the anti-parallel diagram 456 to one similar to the one shown in the neutral polarity diagram 452. Spin orientation covers a spectrum between parallel and anti-parallel states. As the TMR varies between each spin orientation on the spin orientation spectrum, the desired spin orientation of a memory device 410 may be selected from any spin orientation on this spectrum.

The magnetization programming process may be achieved with one terminal or with multiple terminals. Separate terminals may be used to independently bias each VCMA layer. Using separate terminals may enable achieving the desired result with less total applied voltage. Generally, a minimum of three terminals should be used such that there is a mix of write and read terminals. The standard number of terminals as known in the art may be used with the standard mix of read and write terminals. Four terminals may be optimal to use as to be able to bias both the top and the bottom of the memory device 410 independently. Additional terminals may be used as desired. For example, six terminals may be used as may be desired to achieve outcomes for certain complex operations.

In some embodiments of the present disclosure, read and write terminals are decoupled. Moreover, the present disclosure offers high reliability because the voltage applied to achieve the desired results does not need to be a high voltage. Further, the present disclosure does not rely on spin transfer torque. In some embodiments, a simple magnetic stack may be used implementing a free layer (also referred to as a storage layer) and a reference layer. Magnetic domains may be generated in the free layer to store multiple levels of information.

The present disclosure may use but is not reliant upon domain wall propagation. The present disclosure uses magnetic fields to program the memory element and may use the entire area of the free layer for active storage. In some embodiments, the present disclosure may be used to store binary information, whereas in other embodiments, the present disclosure may be used to store non-binary information. Multiple levels of information may be stored in accordance with the present disclosure.

In some embodiments, the preferred or required resistance range for a high-RA component may be between 100,000 and 1,000,000 Ohm·$\mu m^2$. Further, in some embodiments, the preferred or required on/off ratio may be approximately ten (e.g., between six and fourteen). In some embodiments, the present disclosure provides a device capable of storing information in multiple states on a memory device. The present disclosure may enable the use of memory storage using a low level of power in some embodiments.

In some embodiments, an RA of 10,000 Ohm·$\mu m^2$ with a device resistance of 1,000,000 for a 50 nm-by-150 nm area may be preferred. The on/off ratio for such an embodiment may be approximately seven. The write current may be approximately 50 $\mu A$ (which may be comparable to a ST-MRAM write current), and the read current may be 0.2 $\mu A$ at a 0.2 V read bias (which may be comparable to various PCM devices). Such an embodiment could be capable of multistate data storage in accordance with the present disclosure.

A method of producing a memory device in accordance with the present disclosure may include providing a first dielectric layer and depositing a first ferromagnetic layer and a first tunnel barrier layer on the first dielectric layer. The method may further include determining a first shape of the first ferromagnetic layer and the first tunnel barrier layer via patterning and ion beam etching and forming a first dielectric wall perpendicular to the first ferromagnetic layer and the first tunnel barrier layer, wherein the first dielectric wall is adjacent the first ferromagnetic layer and the first tunnel barrier layer. The method may also include depositing a first non-magnetic metal layer adjacent the first dielectric wall, depositing a magnetic tunnel junction stack on the first non-magnetic metal layer, and depositing a second non-magnetic metal layer on the magnetic tunnel junction stack. The method may include depositing a second tunnel barrier layer and a second ferromagnetic layer on the second non-magnetic metal layer, determining a second shape of the second tunnel barrier layer and the second ferromagnetic layer via patterning and ion beam etching, and forming a second dielectric wall perpendicular to the second tunnel barrier layer and the second ferromagnetic layer, wherein the second dielectric wall is adjacent the second tunnel barrier layer and the second ferromagnetic layer. The method may further include depositing a third non-magnetic metal layer adjacent the second dielectric wall and depositing a second dielectric layer on the third non-magnetic metal layer.

Figure 5:
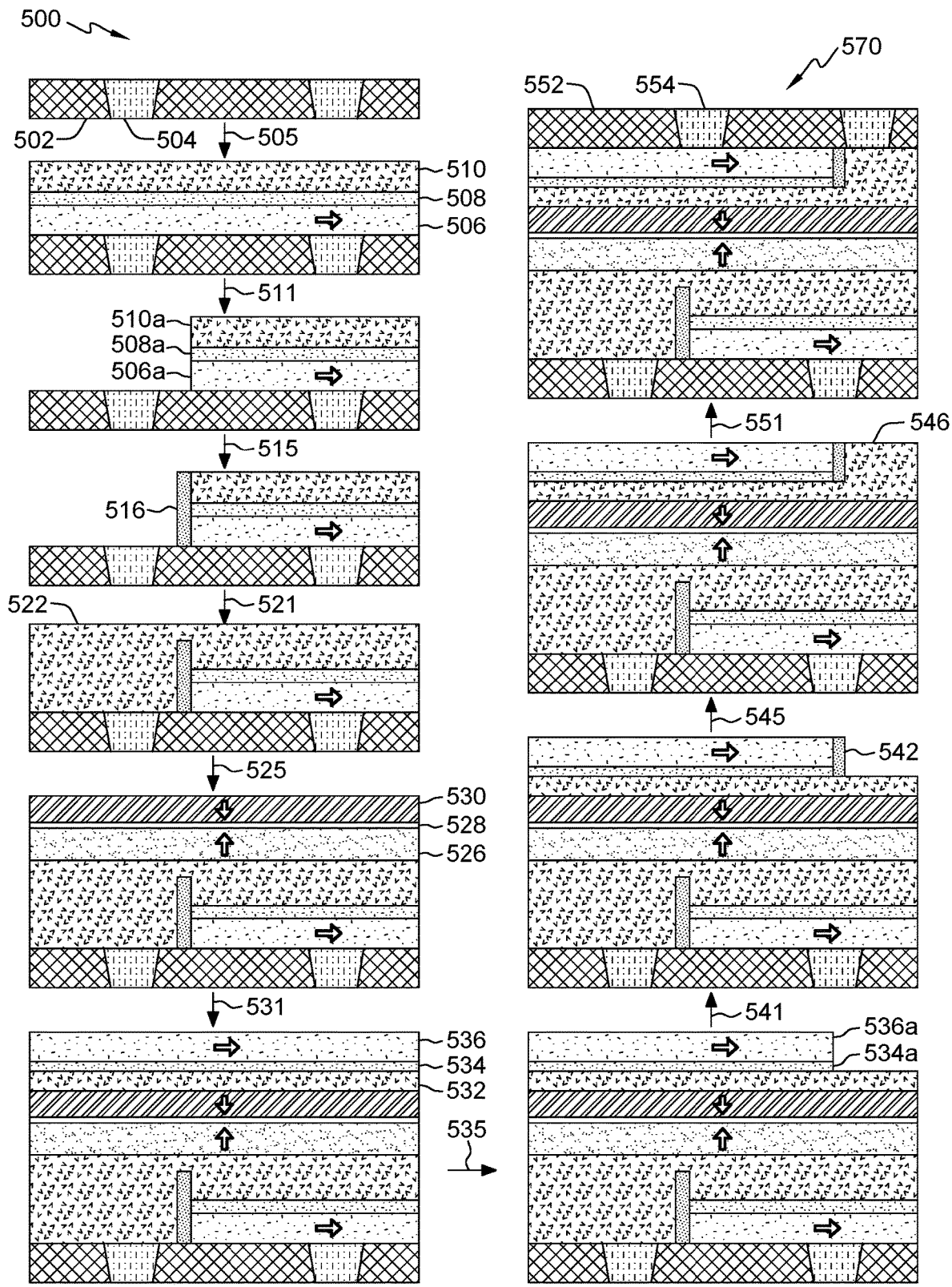
FIG. 5 illustrates production of a memory device in accordance with some embodiments of the present disclosure.

FIG. 5 illustrates production 500 of a memory device 570 in accordance with some embodiments of the present disclosure. A base layer is formed with a bottom contact ILD 502 and studs 504. Layers are deposited 505 on the base layer including an FM layer 506, a TB layer 508, and a metal layer 510. In some embodiments of the present disclosure, an FM layer 506 may be a voltage controlled magnetic anisotropy layer. Patterning and IBE etch 511 determines the shape of the etched FM layer 506a, the etched TB layer 508a, and the etched metal layer 510a. Dielectric is deposited and etched 515 to form a dielectric side wall 516.

In some embodiments of the present disclosure, the method may include chemical mechanical polishing of at least one non-magnetic metal layer. Metal 522 is deposited and chemical mechanically polished 521.

The MTJ stack is deposited 525 on the metal 522. The MTJ stack includes the magnetic storage layer 526 which may also be referred to as the free layer. A thin TB layer 528 is deposited on the magnetic storage layer 526. A reference layer 530 is deposited on the thin TB layer 528.

Additional layers are deposited 531 on the MTJ stack. Metal 532 is deposited on the reference layer 530. A top TB layer 534 is deposited on the metal 532. A top FM layer 534 is deposited on the top TB layer. Patterning and IBE etch 535 determines the shape of the etched top FM layer 534a and the etched top TB layer 536a. A top dielectric is deposited and etched 541 to form a dielectric side wall 542. Metal 546 is deposited and chemical mechanically polished 545. A top ILD layer 552 is deposited and studs 554 are formed to generate 551 the topmost layer and complete production of the depicted memory device 570.

In some embodiments of the present disclosure, applying a voltage between 25 $\mu A$ and 100 $\mu A$ to the voltage controlled magnetic anisotropy layer changes a spin orientation of the magnetic tunnel junction stack.

Any number of methods of production, formation, deposition, etching, polishing, and other processes known in the art may be used in the development of a memory device in accordance with the present disclosure. The production 500 is provided as a reference. Other processes which are currently known in the art, or which may be later developed, may also be used in accordance with the present disclosure.

Figure 6:
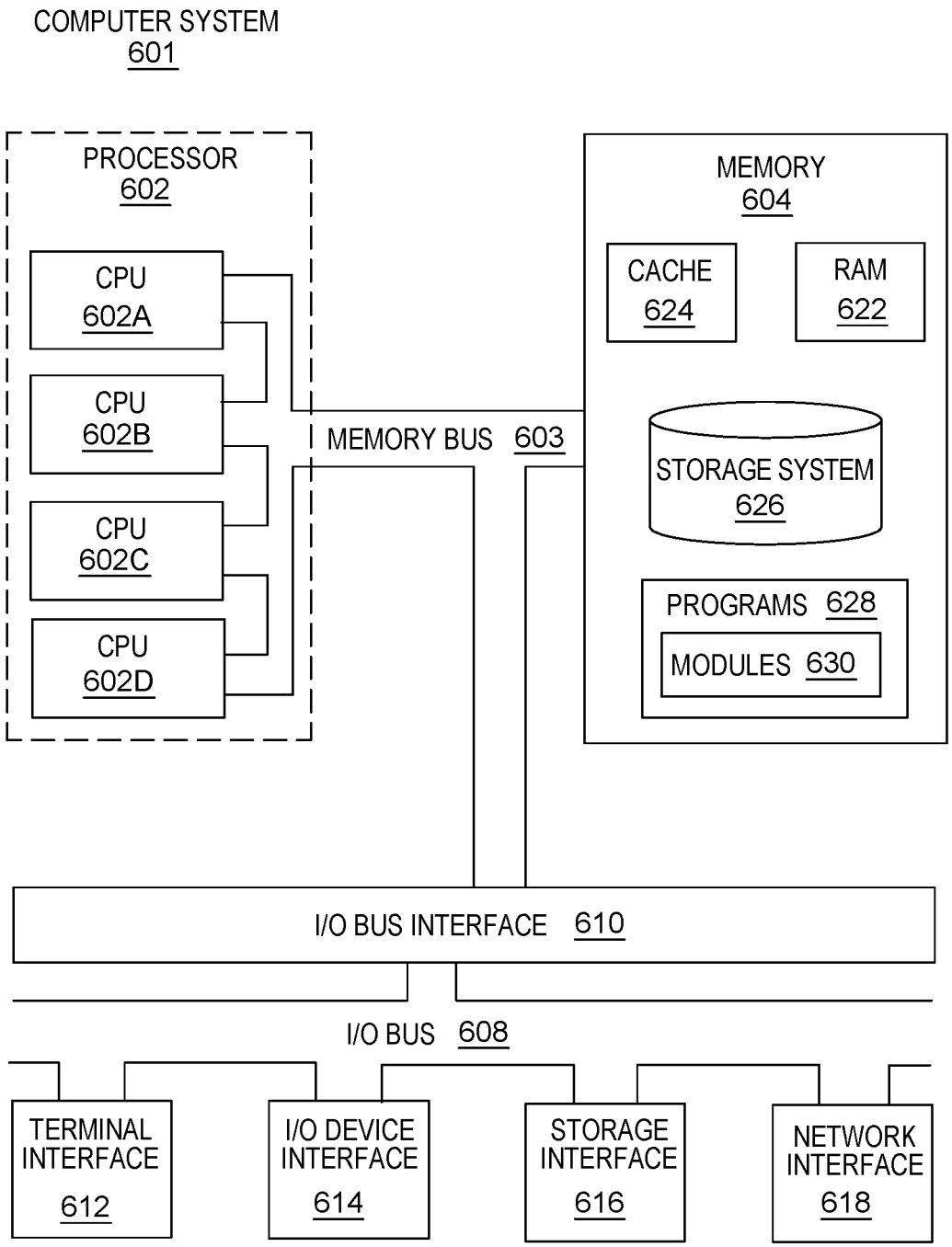
FIG. 6 illustrates a high-level block diagram of an example computer system that may be used in implementing one or more of the methods, tools, and modules, and any related functions, described herein, in accordance with embodiments of the present disclosure.

FIG. 6 illustrates a high-level block diagram of an example computer system 601 that may be used in implementing one or more of the methods, tools, and modules, and any related functions, described herein (e.g., using one or more processor circuits or computer processors of the computer) in accordance with embodiments of the present disclosure. In some embodiments, the major components of the computer system 601 may comprise a processor 602 with one or more central processing units (CPUs) 602A, 602B, 602C, and 602D, a memory subsystem 604, a terminal interface 612, a storage interface 616, an I/O (Input/Output) device interface 614, and a network interface 618, all of which may be communicatively coupled, directly or indirectly, for inter-component communication via a memory bus 603, an I/O bus 608, and an I/O bus interface unit 610.

The computer system 601 may contain one or more general-purpose programmable CPUs 602A, 602B, 602C, and 602D, herein generically referred to as the CPU 602. In some embodiments, the computer system 601 may contain multiple processors typical of a relatively large system; however, in other embodiments, the computer system 601 may alternatively be a single CPU system. Each CPU 602 may execute instructions stored in the memory subsystem 604 and may include one or more levels of on-board cache.

System memory 604 may include computer system readable media in the form of volatile memory, such as random access memory (RAM) 622 or cache memory 624. Computer system 601 may further include other removable/non-removable, volatile/non-volatile computer system storage media. By way of example only, storage system 626 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM, or other optical media can be provided. In addition, memory 604 can include flash memory, e.g., a flash memory stick drive or a flash drive. Memory devices can be connected to memory bus 603 by one or more data media interfaces. The memory 604 may include at least one program product having a set (e.g., at least one) of program modules that are configured to carry out the functions of various embodiments.

One or more programs/utilities 628, each having at least one set of program modules 830, may be stored in memory 604. The programs/utilities 628 may include a hypervisor (also referred to as a virtual machine monitor), one or more operating systems, one or more application programs, other program modules, and program data. Each of the operating systems, one or more application programs, other program modules, and program data, or some combination thereof, may include an implementation of a networking environment. Programs 628 and/or program modules 630 generally perform the functions or methodologies of various embodiments.

Although the memory bus 603 is shown in FIG. 6 as a single bus structure providing a direct communication path among the CPUs 602, the memory subsystem 604, and the I/O bus interface 610, the memory bus 603 may, in some embodiments, include multiple different buses or communication paths, which may be arranged in any of various forms, such as point-to-point links in hierarchical, star, or web configurations, multiple hierarchical buses, parallel and redundant paths, or any other appropriate type of configuration. Furthermore, while the I/O bus interface 610 and the I/O bus 608 are shown as single respective units, the computer system 601 may, in some embodiments, contain multiple I/O bus interface units 610, multiple I/O buses 608, or both. Further, while multiple I/O interface units 610 are shown, which separate the I/O bus 608 from various communications paths running to the various I/O devices, in other embodiments some or all of the I/O devices may be connected directly to one or more system I/O buses 608.

In some embodiments, the computer system 601 may be a multi-user mainframe computer system, a single-user system, a server computer, or similar device that has little or no direct user interface but receives requests from other computer systems (clients). Further, in some embodiments, the computer system 601 may be implemented as a desktop computer, portable computer, laptop or notebook computer, tablet computer, pocket computer, telephone, smartphone, network switches or routers, or any other appropriate type of electronic device.

It is noted that FIG. 6 is intended to depict the representative major components of an exemplary computer system 601. In some embodiments, however, individual components may have greater or lesser complexity than as represented in FIG. 6, components other than or in addition to those shown in FIG. 6 may be present, and the number, type, and configuration of such components may vary.

It is to be understood that although this disclosure includes a detailed description on cloud computing, implementation of the teachings recited herein are not limited to a cloud computing environment. Rather, embodiments of the present disclosure are capable of being implemented in conjunction with any other type of computing environment currently known or that which may be later developed.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide, or other transmission media (e.g., light pulses passing through a fiber-optic cable) or electrical signals transmitted through a wire.

Computer readable program instructions described herein can be downloaded to respective computing/processing devices from a computer readable storage medium or to an external computer or external storage device via a network, for example, the Internet, a local area network, a wide area network, and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer, or entirely on a remote computer or server. In the latter scenario, the remote computer may be connected to the user's computer through any type of network, including a local area network (LAN) or a wide area network (WAN) or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions which comprises one or more executable instructions for implementing the specified logical function(s). In some alternative implementations, the functions noted in the blocks may occur out of the order noted in the figures. For example, two blocks shown in succession may, in fact, be accomplished as one step, executed concurrently, substantially concurrently, in a partially or wholly temporally overlapping manner, or the blocks may sometimes be executed in the reverse order depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although the present disclosure has been described in terms of specific embodiments, it is anticipated that alterations and modification thereof will become apparent to the skilled in the art. The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or the technical improvement over technologies found in the marketplace or to enable others of ordinary skill in the art to understand the embodiments disclosed herein. Therefore, it is intended that the following claims be interpreted as covering all such alterations and modifications as fall within the true spirit and scope of the disclosure.

What is claimed is:

1. A memory device, said memory system comprising:
   a magnetic tunnel junction stack;
   a first high resistance tunnel barrier;
   a first voltage controlled magnetic anisotropy write layer adjacent said high resistance tunnel barrier, wherein said first voltage controlled magnetic anisotropy write layer comprises a magnetic material in direct contact with a high resistance tunnel barrier; and
   a second voltage controlled magnetic anisotropy write layer.

2. The memory device of claim 1 wherein said magnetic tunnel junction stack comprises:
   a storage layer;
   a reference layer; and a tunnel barrier between said storage layer and said reference layer.

3. The memory device of claim 2 wherein:
said tunnel barrier separates a magnetic storage layer from a magnetic reference layer in said magnetic junction stack; and
a voltage applied with said first voltage controlled magnetic anisotropy write layer affects a spin orientation of said magnetic storage layer.

4. The memory device of claim 3 wherein:
changing said spin orientation of said magnetic storage layer changes a tunneling magnetoresistance of said magnetic storage layer.

5. The memory device of claim 2 further comprising:
a second high resistance tunnel barrier.

6. The memory device of claim 1 further comprising:
a non-magnetic metal between said magnetic tunnel junction stack and said first high resistance tunnel barrier.

7. The memory device of claim 1 wherein:
applying a voltage to said first voltage controlled magnetic anisotropy write layer alters a spin orientation of said magnetic tunnel junction stack.

8. The memory device of claim 6 wherein:
said first voltage controlled magnetic anisotropy write layer may apply a write current between 25 µA and 100 µA to alter said spin orientation of said magnetic tunnel junction stack.

9. The memory device of claim 1 wherein:
a read current of said memory system is between 0.05 µA and 0.5 µA.

10. The memory device of claim 1 wherein:
said first voltage controlled magnetic anisotropy write layer is ferromagnetic.

11. The memory device of claim 1 wherein:
said first high resistance tunnel barrier has a resistance greater than 90,000 ohms.

12. The memory device of claim 1 wherein:
an on/off ratio of said memory system is between 6 and 14.

13. A method of storing data, said method comprising:
providing a magnetic tunnel junction memory device with a magnetic storage layer, a tunnel barrier layer, a reference layer, a first voltage controlled magnetic anisotropy write layer, and a second voltage controlled magnetic anisotropy write layer; and
applying a voltage to said first voltage controlled magnetic anisotropy write layer, wherein said voltage changes a magnetization of said voltage controlled magnetic anisotropy write layer.

14. The method of claim 13 wherein:
changing said magnetization of said voltage controlled magnetic anisotropy write line changes a spin orientation of said magnetic storage layer.

15. The method of claim 13 wherein:
said voltage applied to said first voltage controlled magnetic anisotropy write layer is a write current between 25 µA and 100 µA.

16. A method, said method comprising:
providing a first dielectric layer;
depositing a first ferromagnetic layer and a first tunnel barrier layer on said first dielectric layer;
determining a first shape of said first ferromagnetic layer and said first tunnel barrier layer via patterning and ion beam etching;
forming a first dielectric wall perpendicular to said first ferromagnetic layer and said first tunnel barrier layer, wherein said first dielectric wall is adjacent said first ferromagnetic layer and said first tunnel barrier layer;
depositing a first non-magnetic metal layer adjacent said first dielectric wall;
depositing a magnetic tunnel junction stack on said first non-magnetic metal layer;
depositing a second non-magnetic metal layer on said magnetic tunnel junction stack;
depositing a second tunnel barrier layer and a second ferromagnetic layer on said second non-magnetic metal layer;
determining a second shape of said second tunnel barrier layer and said second ferromagnetic layer via patterning and ion beam etching;
forming a second dielectric wall perpendicular to said second tunnel barrier layer and said second ferromagnetic layer, wherein said second dielectric wall is adjacent said second tunnel barrier layer and said second ferromagnetic layer;
depositing a third non-magnetic metal layer adjacent said second dielectric wall; and
depositing a second dielectric layer on said third non-magnetic metal layer.

17. The method of claim 16 further comprising:
chemical mechanical polishing of at least one of said first non-magnetic metal layer, said non-magnetic metal layer, and said third non-magnetic metal layer.

18. The method of claim 16 wherein said magnetic tunnel junction stack comprises:
a magnetic storage layer;
a thin tunnel barrier layer; and
a reference layer.

19. The method of claim 16 wherein:
said first ferromagnetic layer is a voltage controlled magnetic anisotropy layer.

20. The method of claim 19 wherein:
applying a voltage between 25 µA and 100 µA to said voltage controlled magnetic anisotropy layer changes a spin orientation of said magnetic tunnel junction stack.

* * * * *